United States Patent
Abe et al.

(10) Patent No.: US 10,657,999 B2
(45) Date of Patent: May 19, 2020

(54) PLASMA CVD DEVICE AND METHOD OF MANUFACTURING MAGNETIC RECORDING MEDIUM

(71) Applicant: Advanced Material Technologies, Inc., Chiba (JP)

(72) Inventors: Kouji Abe, Chiba (JP); Toshiyuki Watanabe, Chiba (JP); Masafumi Tanaka, Chiba (JP); Kohei Okudaira, Chiba (JP); Hiroyasu Sekino, Chiba (JP); Yuuji Honda, Chiba (JP)

(73) Assignee: ADVANCED MATERIAL TECHNOLOGIES, INC., Chiba (JP)

( * ) Notice: Subject to any disclaimer, the term of this patent is extended or adjusted under 35 U.S.C. 154(b) by 554 days.

(21) Appl. No.: 15/319,149

(22) PCT Filed: Jun. 20, 2014

(86) PCT No.: PCT/JP2014/066415
§ 371 (c)(1),
(2) Date: Dec. 15, 2016

(87) PCT Pub. No.: WO2015/194031
PCT Pub. Date: Dec. 23, 2015

(65) Prior Publication Data
US 2017/0133048 A1    May 11, 2017

(51) Int. Cl.
*G11B 5/85* (2006.01)
*C23C 16/503* (2006.01)
(Continued)

(52) U.S. Cl.
CPC ............... *G11B 5/85* (2013.01); *C23C 16/26* (2013.01); *C23C 16/4412* (2013.01);
(Continued)

(58) Field of Classification Search
CPC ........... G11B 5/85; G11B 5/72; G11B 5/8408; C23C 16/26; C23C 16/50; C23C 16/458;
(Continued)

(56) References Cited

U.S. PATENT DOCUMENTS 5,679,431 A * 10/1997 Chen .................. C23C 14/0605
                                                                204/192.12
6,213,049 B1 * 4/2001 Yang ...................... B05B 7/226
                                                                118/723 DC
(Continued)

FOREIGN PATENT DOCUMENTS

JP     2010-13675      1/2010
JP     2010-285650     12/2010
(Continued)

OTHER PUBLICATIONS

English translation of WO 2012073384 A1 (Year: 2012).*
(Continued)

*Primary Examiner* — Jeffrie R Lund
(74) *Attorney, Agent, or Firm* — Wenderoth, Lind & Ponack, L.L.P.

(57) ABSTRACT

A plasma CVD device includes a chamber (102), an anode (104), a cathode (103), a holding portion which holds a substrate to be deposited (101) a plasma wall (88) an anti-adhesion member (91) which is arranged between a first gap (81) between the anode and the plasma wall and a first inner surface (102a) of the chamber and a pedestal (92) which is arranged between the anti-adhesion member and a back surface of the anode and which is electrically connected to the anode. The maximum diameter of each of the first gap, a second gap (82) between the anode and the anti-adhesion member, a third gap (83) between the back surface of the anode and the pedestal, a fourth gap (84) between the plasma wall and the anti-adhesion member and
(Continued)

a fifth gap (85) between the anti-adhesion member and the pedestal is equal to or less than 4 mm.

12 Claims, 13 Drawing Sheets

(51) Int. Cl.

| | | |
|---|---|---|
| *G11B 5/84* | (2006.01) | |
| *H01J 37/32* | (2006.01) | |
| *C23C 16/26* | (2006.01) | |
| *C23C 16/44* | (2006.01) | |
| *C23C 16/455* | (2006.01) | |
| *C23C 16/458* | (2006.01) | |
| *C23C 16/50* | (2006.01) | |
| *G11B 5/72* | (2006.01) | |

(52) U.S. Cl.
CPC .......... *C23C 16/455* (2013.01); *C23C 16/458* (2013.01); *C23C 16/50* (2013.01); *C23C 16/503* (2013.01); *G11B 5/72* (2013.01); *G11B 5/8408* (2013.01); *H01J 37/32027* (2013.01); *H01J 37/32532* (2013.01)

(58) Field of Classification Search
CPC . C23C 16/455; C23C 16/4412; C23C 16/503; H01J 37/32532; H01J 37/32027
See application file for complete search history.

(56) References Cited

U.S. PATENT DOCUMENTS

| | | | |
|---|---|---|---|
| 6,641,673 B2* | 11/2003 | Yang ................. | C23C 16/45563 |
| | | | 118/715 |
| 2011/0024049 A1* | 2/2011 | Stevenson ......... | H01J 37/32541 |
| | | | 156/345.53 |
| 2011/0177260 A1 | 7/2011 | Honda et al. | |
| 2012/0125891 A1 | 5/2012 | Matsuda et al. | |
| 2013/0206720 A1* | 8/2013 | Blom ................... | C23C 16/042 |
| | | | 216/13 |
| 2017/0133048 A1* | 5/2017 | Abe ..................... | C23C 16/503 |

FOREIGN PATENT DOCUMENTS

| | | |
|---|---|---|
| JP | 2014-25117 | 2/2014 |
| WO | 2012/073384 | 6/2012 |

OTHER PUBLICATIONS

Translation JP 2010-013675, Jan. 2010.*
Translation JP 2014-025117, Feb. 2014.*
International Search Report dated Sep. 9, 2014 in International Application No. PCT/JP2014/066415.

* cited by examiner ered PLASMA CVD DEVICE AND METHOD OF MANUFACTURING MAGNETIC RECORDING MEDIUM

TECHNICAL FIELD

The present invention relates to a plasma CVD device and a method of manufacturing a magnetic recording medium.

BACKGROUND ART

FIG. 12 is a cross-sectional view schematically showing a conventional plasma CVD device. FIG. 13 is a partially enlarged cross-sectional view of the plasma CVD device shown in FIG. 12. The plasma CVD device is a device which deposits a thin film on both surfaces of a substrate to be deposited 101, and although the plasma CVD device is formed bilaterally symmetrically with respect to the substrate to be deposited 101, only the left-hand side is shown in FIG. 12.

The plasma CVD device includes a chamber 102, and the chamber 102 is electrically connected to a ground (not shown). A filament-shaped cathode electrode 103 made of, for example, tantalum is formed within the chamber 102. Both ends of the cathode electrode 103 are electrically connected to a cathode power source 105, and the cathode power source 105 is electrically connected to the ground 106. A funnel-shaped anode 104 is arranged so as to surround a periphery of the cathode electrode 103. The anode 104 has an electrode surface 104a on its front surface.

The substrate to be deposited 101 is arranged within the chamber 102, and the substrate to be deposited 101 is arranged so as to face the cathode electrode 103 and the electrode surface 104a of the anode 104. The substrate to be deposited 101 is electrically connected to the negative potential side of a bias power source (DC power source) 112 serving as an ion acceleration power source, and the positive potential side of the DC power source 112 is electrically connected to the ground 106.

A plasma wall 108 is arranged within the chamber 102 so as to cover a space between each of the cathode electrode 103 and the anode 104 and the substrate to be deposited 101. A cylindrical anti-adhesion member 91 is arranged between each of the plasma wall 108 and the anode 104 and the inner surface of the chamber 102, and the anti-adhesion member 91 is in contact with the inner surface of the chamber 102.

A pedestal 92 is arranged between the anti-adhesion member 91 and the anode 104 and between the back surface of the anode 104 and the inner surface of the chamber 102, and the pedestal 92 is electrically connected to the anode 104. The pedestal 92 is electrically connected to the positive potential side of a DC (direct-current) power source 107, and the negative potential side of the DC power source 107 is electrically connected to the ground 106. Accordingly, the DC power source 107 is electrically connected to the anode 104 via the pedestal 92.

In addition, the plasma CVD device also includes a vacuum exhaust mechanism (not shown) which vacuum-exhausts the inside of the chamber 102. Furthermore, the plasma CVD device also includes a gas supply mechanism (not shown) which supplies a film deposition raw material gas into the chamber (refer to, for example, Patent Literature 1).

In the conventional plasma CVD device described above, since a gap is present between the anode 104 and the anti-adhesion member 91, an abnormal discharge may be generated in the gap while a CVD film is deposited on the substrate to be deposited. When such an abnormal discharge is generated, the formed CVD film may become defective. The generation of an abnormal discharge is required to be suppressed in order that the failure of the CVD film may be reduced.

PRIOR ART DOCUMENT

Patent Document

[Patent Literature 1] Japanese Unexamined Patent Application Publication No. 2014-25117

DISCLOSURE OF THE INVENTION

Problem to be Solved

An aspect of the present invention has an object to reduce the generation of an abnormal discharge while a CVD film is deposited.

Solutions to the Problems

Hereinafter, various aspects of the present invention will be explained.

[1] A plasma CVD device including: a chamber; an anode which is arranged within the chamber and which has an electrode surface on a front surface; a cathode which is arranged within the chamber; a holding portion which is arranged within the chamber and which holds a substrate to be deposited which is arranged so as to face the electrode surface of the anode and the cathode; a plasma wall which is arranged within the chamber and which is provided so as to cover a space between the substrate to be deposited held by the holding portion and each of the electrode surface of the anode and the cathode; an anti-adhesion member which is arranged between a first gap between the anode and the plasma wall and a first inner surface of the chamber and which is in contact with the first inner surface of the chamber; a pedestal which is arranged between the anti-adhesion member and a back surface of the anode and between the back surface of the anode and a second inner surface of the chamber and which is electrically connected to the anode; a spacer which is arranged between the back surface of the anode and a third inner surface of the chamber and which is in contact with the third inner surface; a first direct-current power source which is electrically connected to the pedestal; an alternating-current power source which is electrically connected to the cathode; a second direct-current power source which is electrically connected to the substrate to be deposited held by the holding portion; a gas supply mechanism which supplies a raw material gas into the chamber; and an exhaust mechanism which exhausts the chamber, wherein each of a maximum diameter of the first gap, a maximum diameter of a second gap between the anode and the anti-adhesion member, a maximum diameter of a third gap between the back surface of the anode and the spacer, a maximum diameter of a fourth gap between the plasma wall and the anti-adhesion member, a maximum diameter of a fifth gap between the anti-adhesion member and the pedestal and a maximum diameter of a sixth gap between the pedestal and the spacer is equal to or less than 4 mm (preferably equal to or less than 3 mm).

[2] The plasma CVD device according to [1] described above, wherein an insulator is formed on each of a surface facing each of the first gap and the second gap of the anode, a surface facing each of the third gap and the sixth gap of the spacer, a surface facing each of the second gap, the fourth gap and the fifth gap of the anti-adhesion member, a surface facing each of the fifth gap, the sixth gap and the second inner surface of the pedestal and a surface facing each of the first gap and the fourth gap of the plasma wall.

Note that the above description in which the maximum diameter is equal to or less than 4 mm (preferably equal to or less than 3 mm) means that in a case where an insulator is formed on, for example, a surface facing each of the first gap and the second gap of the anode, the maximum diameter from the surface of the insulator is set equal to or less than 4 mm (preferably equal to or less than 3 mm).

[3] The plasma CVD device according to [2] described above, wherein an insulator is formed on each of a surface facing the first inner surface of the anti-adhesion member and a surface facing the third inner surface of the spacer.

[4] The plasma CVD device according to [1] described above, wherein each of the spacer, the anti-adhesion member and the plasma wall is formed of an insulator, and an insulator is formed on each of a surface facing each of the first gap and the second gap of the anode and a surface facing each of the fifth gap, the sixth gap and the second inner surface of the pedestal.

[5] The plasma CVD device according to any one of [2] to [4] described above, wherein an insulator is formed on a surface facing the third gap of the back surface of the anode.

[6] The plasma CVD device according to any one of [2] to [5] described above, wherein an insulator is formed on a surface other than the electrode surface of the anode.

[7] The plasma CVD device according to any one of [2] to [6] described above, wherein the insulator is a substance which has a volume resistivity of $1 \times 10^{10}$ Ωcm or more (preferably $1 \times 10^{12}$ Ωcm or more) at 20° C. and which has heat resistance to 100° C.

[8] The plasma CVD device according to any one of [2] to [7] described above, wherein the insulator is individually any of glass, quartz, resin, ceramics, a thermally sprayed insulator, an insulator subjected to alumite treatment and ceramic plating.

Note that all of the insulators may have the same material or may have different materials.

[9] The plasma CVD device according to [1] described above, wherein a thermally sprayed conductive film is formed on a surface of the anode.

[10] The plasma CVD device according to any one of [2] to [8] described above, wherein a thermally sprayed conductive film is formed either on a surface on which the insulator of the anode is not formed or on the electrode surface of the anode.

[11] A method of manufacturing a magnetic recording medium with the plasma CVD device according to any one of [1] to [10] described above, wherein a substrate to be deposited in which at least a magnetic layer is formed on a non-magnetic substrate is held by the holding portion, and the raw material gas is brought into a plasma state by a discharge between the cathode and the electrode surface of the anode within the chamber, and the plasma is accelerated to collide with a surface of said substrate to be deposited held by the holding portion to thereby form a protective layer whose main component is carbon.

[12] A method of manufacturing a magnetic recording medium in which a protective layer whose main component is carbon is formed, after at least a magnetic layer is formed on a non-magnetic substrate, wherein the protective layer is formed using the plasma CVD device according to any one of [1] to [10] described above.

Advantageous Effects of Invention

According to the aspect of the present invention, it is possible to suppress the generation of an abnormal discharge while the CVD film is deposited.

BEST MODE FOR CARRYING OUT THE INVENTION

Hereinafter, embodiments of the present invention will be explained in detail through the use of the drawings. However, a person skilled in the art would easily understand that the present invention is not limited to the following explanation, but forms and details thereof can be variously modified without deviating from the purport and the scope of the present invention. Accordingly, the present invention is not to be construed as being limited to description of the embodiments shown below.

Embodiment 1

<Plasma CVD Device>

Figure 1:
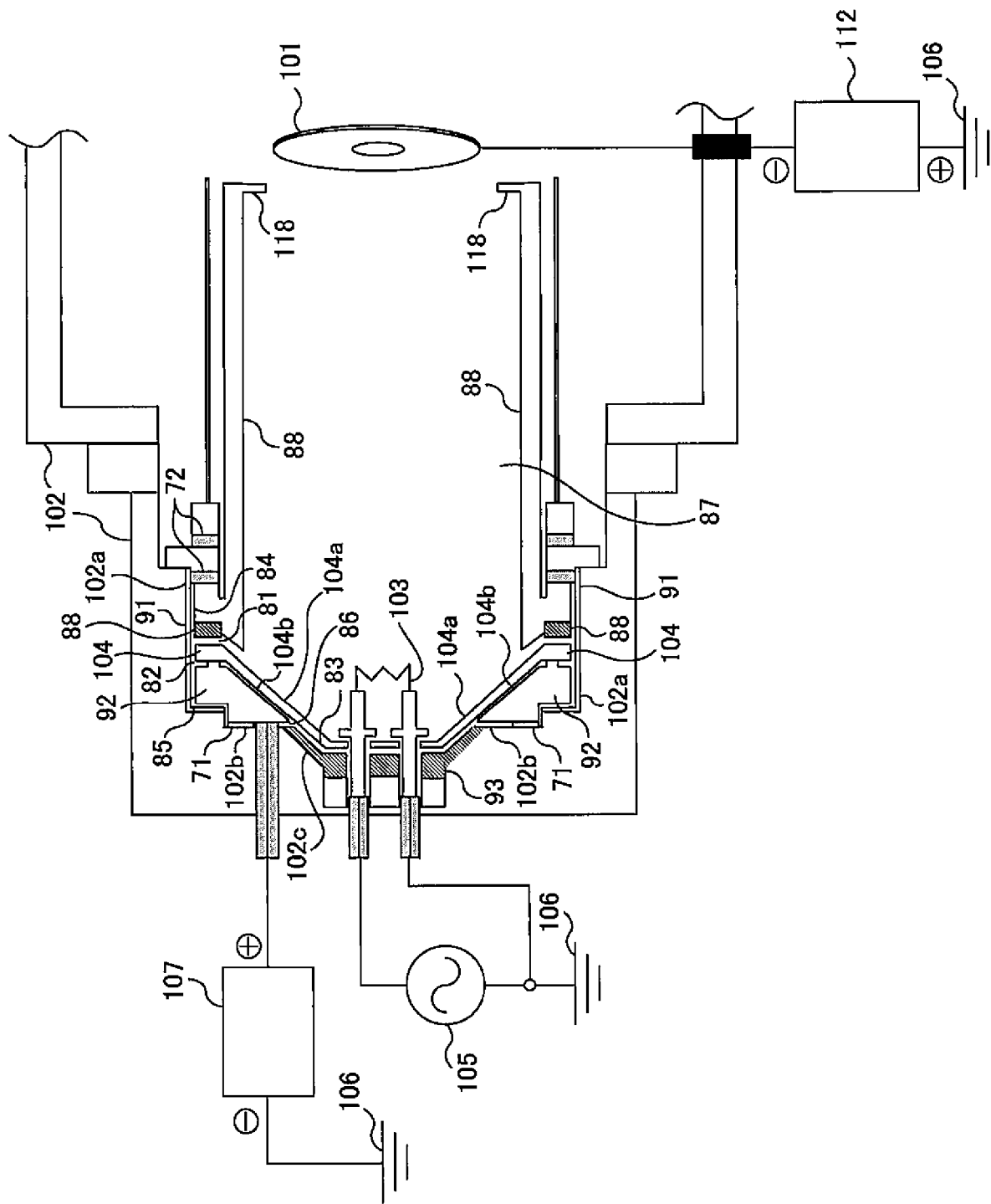
FIG. 1 is a cross-sectional view schematically showing a plasma CVD device according to an aspect of the present invention.
Figure 2:
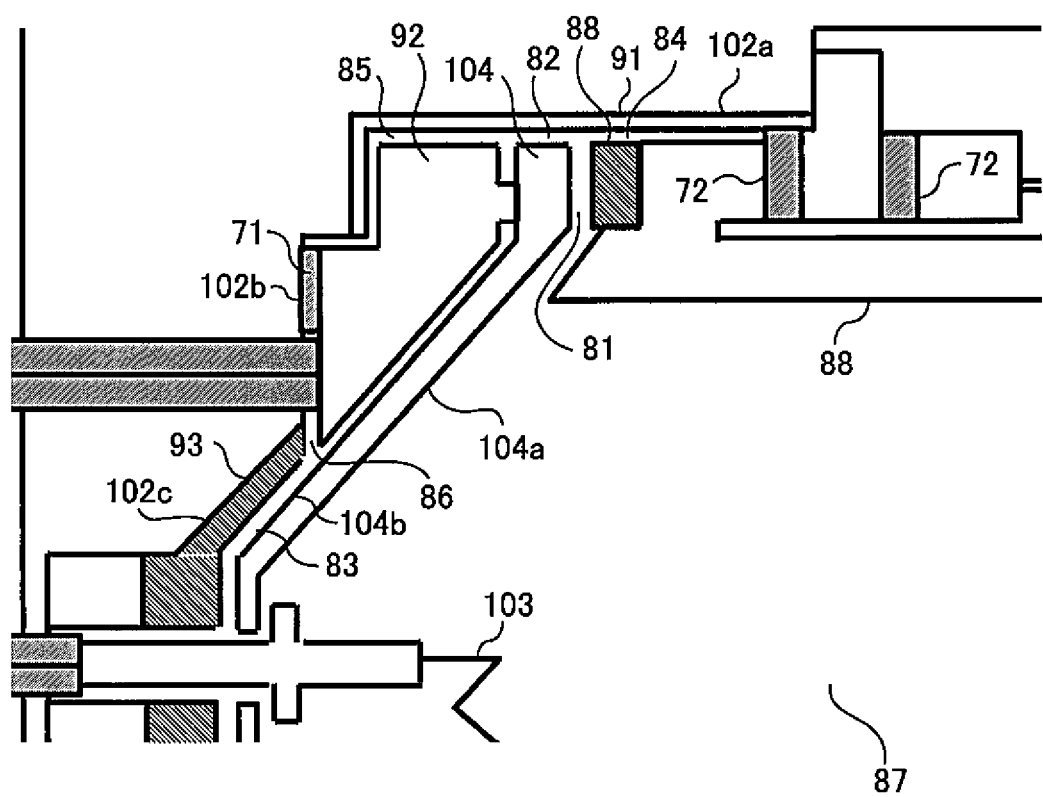
FIG. 2 is a partially enlarged cross-sectional view of the plasma CVD device shown in FIG. 1.

FIG. 1 is a cross-sectional view schematically showing a plasma CVD device according to an aspect of the present invention. FIG. 2 is a partially enlarged cross-sectional view of the plasma CVD device shown in FIG. 1. The plasma CVD device has a structure which is bilaterally symmetric with respect to a substrate to be deposited (for example, a disc substrate) 1, and although the plasma CVD device is a device which can simultaneously deposit a film on both surfaces of the substrate to be deposited 1, only the left-hand side is shown in FIG. 1.

The plasma CVD device includes a chamber 102, and the chamber 102 is electrically connected to a ground (not shown). A filament-shaped cathode electrode 103 made of, for example, tantalum is formed within the chamber 102.

A funnel-shaped anode 104 is arranged within the chamber 102 so as to surround a periphery of the cathode electrode 103, and the anode 104 is formed substantially in the shape of a speaker. The anode 104 has an electrode surface 104a on its front surface.

The substrate to be deposited 101 is arranged within the chamber 102, and the substrate to be deposited 101 is arranged so as to face the cathode electrode 103 and the electrode surface 104a of the anode 104. Specifically, the cathode electrode 103 is surrounded in the vicinity of the central portion of the electrode surface 104a of the anode 104, and the anode 104 is arranged with its maximum inside diameter side facing toward the substrate to be deposited 101.

The substrate to be deposited 101 is sequentially supplied to a position shown in the figure by an unillustrated holder (holding portion) and an unillustrated transfer device (a handling robot or a rotary index table).

A cylindrical or polygonal plasma wall 88 is arranged within the chamber 102 so as to cover a space 87 between the substrate to be deposited 101 held by the holder and each of the electrode surface 104a of the anode 104 and the cathode electrode 103. The plasma wall 88 is arranged in a state of being insulated by an insulator 72 from the chamber 102. The plasma wall 88 is electrically connected to a float potential (not shown).

A first gap 81 is formed between the plasma wall 88 and the anode 104, a cylindrical anti-adhesion member 91 is arranged between the first gap 81 and the first inner surface 102a of the chamber 102 and the anti-adhesion member 91 is in contact with the first inner surface 102a of the chamber 102. The first gap 81 is connected to the space 87 covered by the plasma wall 88.

A pedestal 92 is arranged between the anti-adhesion member 91 and the back surface 104b of the anode 104 and between the back surface 104b of the anode 104 and the second inner surface 102b of the chamber 102, and the pedestal 92 is electrically insulated by an insulator 71 from the chamber 102. The pedestal 92 is electrically connected to the back surface 104b of the anode 104.

A spacer 93 is arranged between the back surface 104b of the anode 104 and the third inner surface 102c of the chamber 102, and the spacer 93 is in contact with the third inner surface 102c of the chamber 102.

A second gap 82 is formed between the anode 104 and the anti-adhesion member 91, and a third gap 83 is formed between the back surface 104b of the anode 104 and the spacer 93. A fourth gap 84 is formed between the plasma wall 88 and the anti-adhesion member 91, and a fifth gap 85 is formed between the anti-adhesion member 91 and the pedestal 92. A sixth gap 86 is formed between the pedestal 92 and the spacer 93.

The first gap 81 is spatially connected to each of the second gap 82 and the fourth gap 84, and the second gap 82 is spatially connected to the fifth gap 85. The fifth gap 85 is spatially connected to the sixth gap 86, and the sixth gap 86 is spatially connected to the third gap 83. The maximum diameter of each of the first gap 81, the second gap 82, the third gap 83, the fourth gap 84, the fifth gap 85 and the sixth gap 86 is equal to or less than 4 mm (preferably equal to or less than 3 mm).

At the end portion of the plasma wall 88 on the side of the substrate to be deposited 101, a film thickness correction plate 118 is provided. The film thickness correction plate 118 is electrically connected to the float potential. It is possible to control the thickness of a film formed on the outer circumferential portion of the substrate to be deposited 101, by using the film thickness correction plate 118.

Both ends of the cathode electrode 103 are electrically connected to a cathode power source 105 located outside of the chamber 102, and the cathode power source 105 is arranged in a state of being insulated from the chamber 102. The cathode power source 105 is controlled by an unillustrated control portion. Accordingly, a voltage applied to the cathode electrode 103 is controlled. Note that, for example, a power source of 0 to 50 V and 10 to 50 A (ampere) can be used as the cathode power source 105. The cathode power source 105 is electrically connected to a ground 106.

The pedestal 92 is electrically connected to the positive potential side of a DC (direct-current) power source 107, and the negative potential side of the DC power source 107 is electrically connected to the ground 106. In this way, the DC power source 107 is electrically connected to the back surface 104b of the anode 104 via the pedestal 92.

The DC power source 107 is arranged in a state of being insulated from the chamber 102. The DC power source 107 is controlled by the control portion. Accordingly, a voltage applied to the electrode surface 104a of the anode 104 is controlled. Note that, for example, a power source of 0 to 500 V and 0 to 7.5 A (ampere) can be used as the DC power source 107.

The substrate to be deposited 101 is electrically connected to a bias power source (DC power source, direct-current power source) 112 serving as an ion acceleration power source, and the DC power source 112 is arranged in a state of being insulated from the chamber 102. The negative potential side of the DC power source 112 is electrically connected to the substrate to be deposited 101, and the positive potential side of the DC power source 112 is electrically connected to the ground 106. The DC power source 112 is controlled by the control portion. Accordingly, a voltage applied to the substrate to be deposited 101 is controlled. Note that a power source of, for example, 0 to 1500 V and 0 to 100 mA (milliampere) can be used as the DC power source 112.

In addition, the plasma CVD device includes a vacuum exhaust mechanism (not shown) which vacuum-exhausts the inside of the chamber 102. Furthermore, the plasma CVD device also includes a gas supply mechanism (not shown) which supplies a film deposition raw material gas into the chamber 102.

<Film Deposition Method>

A method of depositing a film of DLC (Diamond Like Carbon) on the substrate to be deposited 101 by the use of the plasma CVD device shown in FIGS. 1 and 2.

The inside of the chamber 102 is brought into a predetermined vacuum state by the start-up of the vacuum exhaust mechanism, and for example, toluene ($C_7H_8$) gas serving as the film deposition raw material gas is introduced into the chamber 102 by the use of the gas supply mechanism. After the inside of the chamber 102 has a predetermined pressure, an alternating current is supplied to the cathode electrode 103 by the cathode power source 105, and thus the cathode electrode 103 is heated.

Furthermore, a direct current is supplied to the substrate to be deposited 101 by the DC power source 112. A direct current is also supplied from the DC power source 107 to the anode 104. At this time, a voltage applied to the electrode surface 104a of the anode 104 is controlled by the control portion.

A large number of electrons are discharged from a filament of the cathode electrode 103 toward the electrode surface 104a of the anode 104 by the heating of the cathode electrode 103, and a glow discharge is started between the cathode electrode 103 and the electrode surface 104a of the anode 104. The toluene gas serving as the film deposition raw material gas within the chamber 102 is ionized by the large number of electrons and is brought into the plasma state. Then, film deposition raw material molecules in the plasma state are directly accelerated by the negative potential of the substrate to be deposited 101, are flown toward the direction of the substrate to be deposited 101, and are caused to adhere to the surface of the substrate to be deposited 101. Accordingly, a thin DLC film is deposited on the substrate to be deposited 101.

In the present embodiment, the maximum diameter of each of the first gap 81 between the plasma wall 88 and the anode 104, the second gap 82 between the anode 104 and the anti-adhesion member 91, the third gap 83 between the back surface 104b of the anode 104 and the spacer 93, the fourth gap 84 between the plasma wall 88 and the anti-adhesion member 91, the fifth gap 85 between the anti-adhesion member 91 and the pedestal 92 and the sixth gap 86 between the pedestal 92 and the spacer 93 is equal to or less than 4 mm (preferably equal to or less than 3 mm). Thereby, the maximum diameter of the gap in which an abnormal discharge is highly likely to occur can be set equal to or less than 4 mm (preferably equal to or less than 3 mm). When the maximum diameter of the gap is equal to or less than 4 mm, it is not possible to perform a discharge in the gap, and thus it is possible to suppress the generation of an abnormal discharge when depositing the DLC film on the substrate to be deposited 101. Accordingly, it is possible to suppress the deposition of a defective DLC film, and thus it is possible to reduce the failure of the DLC film.

Furthermore, although when an abnormal discharge is generated, the DLC film may be deposited on a portion other than the substrate to be deposited 101 by the abnormal discharge, and thus it is possible to suppress the deposition of the DLC film on the part (for example, the gas discharge port or the like of the raw material gas) other than the substrate to be deposited 101 by suppression of the abnormal discharge.

Moreover, although as a higher voltage is applied to the electrode surface 104a of the anode 104, an abnormal discharge is more likely to occur, in the present embodiment, it is possible to suppress the generation of the abnormal discharge, and thus it is possible to apply a high voltage to the electrode surface 104a of the anode 104. Accordingly, it is possible to increase the deposition rate of the DLC film, and thus it is possible to reduce the film deposition time. A high voltage is applied to the electrode surface 104a of the anode 104, and thus it is possible to reduce power supplied to the cathode electrode 103.

Note that, although in the present embodiment, a conductive film is not formed on the surface of the anode 104, there is no limitation on this configuration, and a conductive film (not shown) which is thermally sprayed on the surface of the anode 104 may be formed. First to fourth conductive films below can be used as the thermally sprayed conductive film. Here, the thermal spraying refers to a surface processing method in which particles brought into a molten state or a state close to melting by heating are sprayed on the surface of an item and thus a film is formed.

The thermally sprayed first conductive film may be a film which is formed of a material containing 10 weight % or more of at least one of Cr, W and Mo.

Furthermore, the thermally sprayed second conductive film is formed of a material that contains Cr whose content is equal to or more than 1 weight % but equal to or less than 50 weight % (preferably equal to or more than 5 weight % but equal to or less than 50 weight %, more preferably equal to or more than 1 weight % but equal to or less than 20 weight % and much more preferably equal to or more than 5 weight % but equal to or less than 15 weight % or equal to or more than 9 weight % but equal to or less than 20 weight % and further preferably equal to or more than 9.50 weight % but equal to or less than 16.2 weight % or equal to or more than 1 weight % but equal to or less than 10 weight % and more preferably equal to or more than 5 weight % but equal to or less than 10 weight %), that also contains WC whose content is equal to or more than 0 weight % but equal to or less than 49 weight % (preferably equal to or more than 0.01 weight % but equal to or less than 49 weight %, more preferably equal to or more than 20 weight % but equal to or less than 49 weight %, much more preferably equal to or more than 30 weight % but equal to or less than 40 weight % and further preferably equal to or more than 30 weight % but equal to or less than 35 weight % or equal to or more than 20 weight % but equal to or less than 35 weight %), that also contains Mo whose content is equal to or more than 0 weight % but equal to or less than 49 weight % (preferably equal to or more than 1 weight % but equal to or less than 20 weight %, more preferably equal to or more than 1 weight % but equal to or less than 10 weight %, much more preferably equal to or more than 3 weight % but equal to or less than 10 weight %, further preferably equal to or more than 3 weight % but equal to or less than 6 weight % and much further preferably equal to or more than 3.83 weight % but equal to or less than 6 weight %), that contains 50 weight % or less of the total of Cr, WC and Mo and that contains 0 weight % or more but 50 weight % or less of impurities, and the remaining part is formed of Ni and inevitable impurities.

The impurities here are Fe, Si, C, B, Al and Cu. The second conductive film may contain Fe whose content is equal to or more than 0 weight % but equal to or less than 10 weight % (or equal to or more than 0.01 weight % but equal to or less than 10 weight % or equal to or more than 0.01 weight % but equal to or less than 7 weight % or equal to or more than 2.90 weight % but equal to or less than 7 weight %), may contain Si whose content is equal to or more than 0 weight % but equal to or less than 10 weight % (or equal to or more than 0.01 weight % but equal to or less than 10 weight % or equal to or more than 0 weight % but equal to or less than 5 weight % or equal to or more than 0.01 weight % but equal to or less than 5 weight % or equal to or less than 3.89 weight % or equal to or more than 0.01 weight % but equal to or less than 3.89 weight % or equal to or more than 1 weight % but equal to or less than 3.89 weight % or equal to or less than 2.9 weight % or equal to or more than 0.01 weight % but equal to or less than 2.9 weight % or equal to or more than 1 weight % but equal to or less than 2.9 weight %), may contain C whose content is equal to or more than 0 weight % but equal to or less than 3 weight % (or equal to or less than 1.5 weight % or equal to or less than 0.75 weight % or equal to or less than 0.5 weight %), may contain B whose content is equal to or more than 0 weight % but equal to or less than 7 weight % (or equal to or more than 0.01 weight % but equal to or less than 7 weight % or equal to or less than 4.5 weight % or equal to or more than 0.01 weight % but equal to or less than 4.5 weight % or equal to or less than 3.28 weight % or equal to or more than 0.01 weight % but equal to or less than 3.28 weight % or equal to or less than 2.3 weight %), may contain Al whose content is equal to or more than 0 weight % but equal to or less than 15 weight % (or equal to or less than 9 weight % or equal to or more than 0.01 weight % but equal to or less than 9 weight %) and may contain Cu whose content is equal to or more than 0 weight % but equal to or less than 5 weight % (or equal to or more than 0.01 weight % but equal to or less than 5 weight % or equal to or less than 1.9 weight % or equal to or more than 0.01 weight % but equal to or less than 1.9 weight %).

Furthermore, the thermally sprayed third conductive film is formed of a material which contains Mo, and in which the remaining part is formed of inevitable impurities.

In addition, the thermally sprayed fourth conductive film is a film formed of a material which contains Mo whose content is equal to or more than 80 weight %, and in which the remaining part is formed of impurities and inevitable impurities. Here, the impurities are Fe, Si and C.

As described above, it is possible to suppress an abnormal discharge by forming the thermally sprayed conductive film on the surface of the anode 104. Namely, it is possible to further suppress the generation of an abnormal discharge not only by the addition of the structure in which the maximum diameter of each of the first gap 81, the second gap 82, the third gap 83, the fourth gap 84, the fifth gap 85 and the sixth gap 86 is equal to or less than 4 mm (preferably equal to or less than 3 mm) but also by the formation of the conductive film thermally sprayed on the surface of the anode 104.

<Method of Manufacturing Magnetic Recording Medium>

A method of manufacturing a magnetic recording medium using the plasma CVD device shown in FIGS. 1 and 2 will be explained.

A substrate to be deposited on which at least a magnetic layer is formed on a non-magnetic substrate is first prepared, and the substrate to be deposited is held by the holding portion. Then, the raw material gas is brought into a plasma state by a discharge between the cathode electrode 103 and the electrode surface 104a of the anode 104 which are heated within the chamber 102 under predetermined vacuum conditions and the plasm is accelerated to collide with the surface of the substrate to be deposited held by the holding portion. Accordingly, a protective layer whose main component is carbon is formed on the surface of the substrate to be deposited.

According to the method of manufacturing the magnetic recording medium described above, the maximum diameter of each of the first to sixth gaps 81 to 86 is set to be equal to or less than 4 mm, and thus the generation of an abnormal discharge can be suppressed, with the result that the failure of a protective film can be reduced.

Second Embodiment

Figure 3:
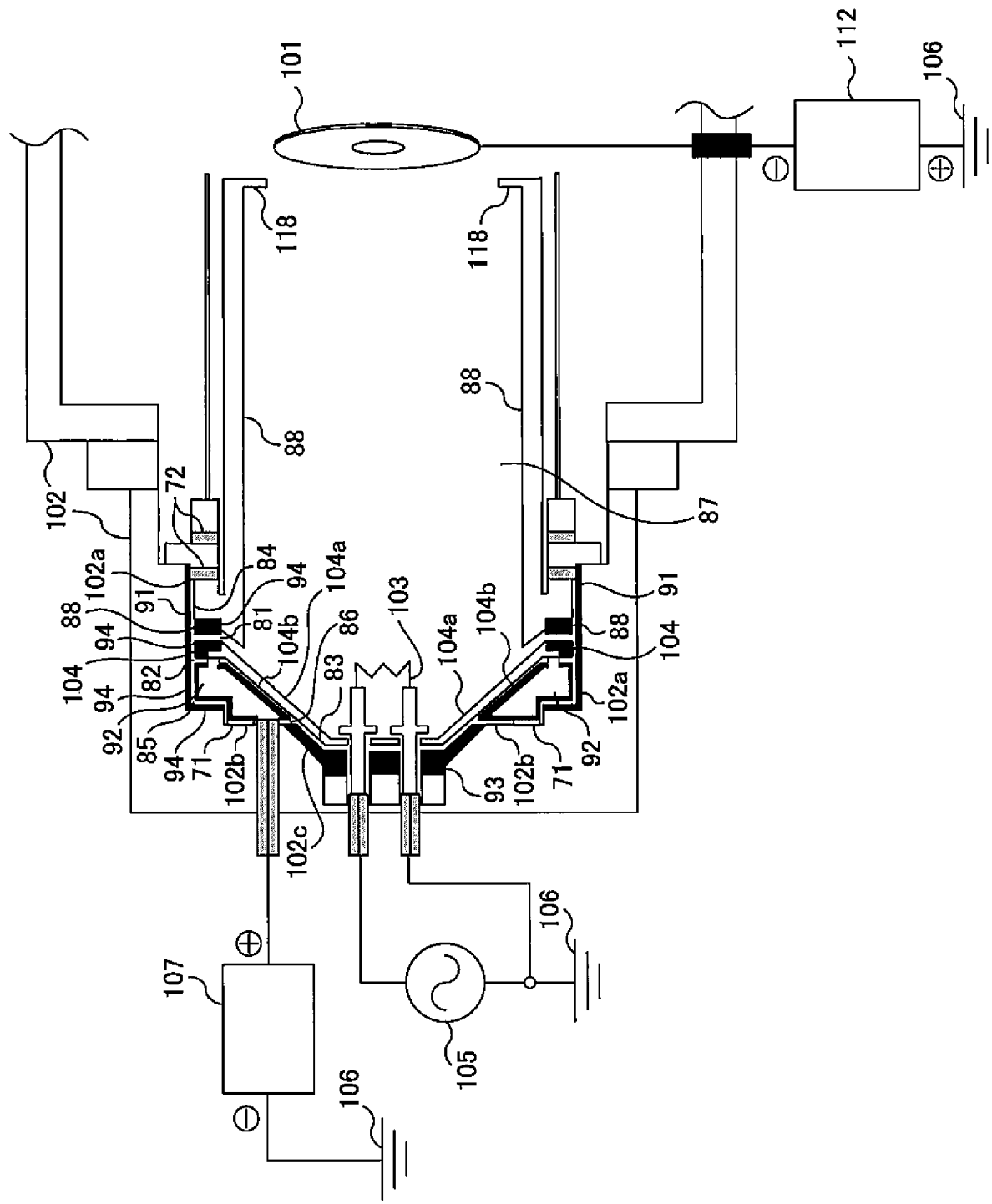
FIG. 3 is a cross-sectional view schematically showing the plasma CVD device according to the aspect of the present invention.
Figure 4:
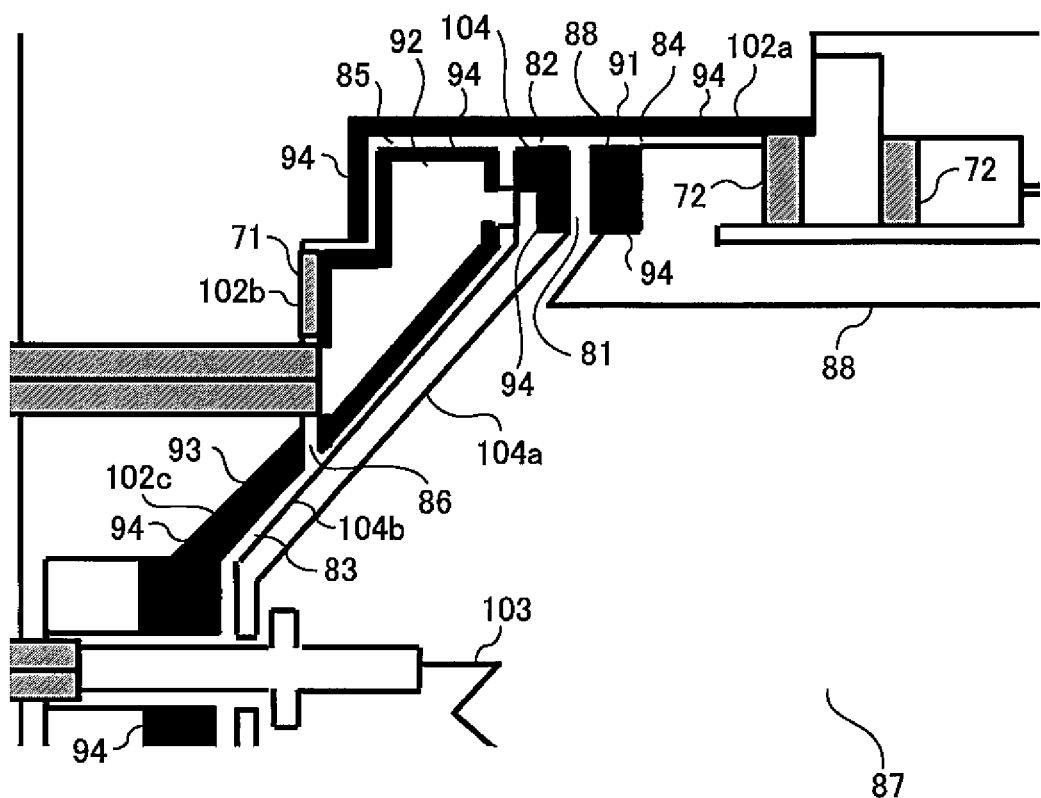
FIG. 4 is a partially enlarged cross-sectional view of the plasma CVD device shown in FIG. 3.

FIG. 3 is a cross-sectional view schematically showing the plasma CVD device according to the aspect of the present invention, and FIG. 4 is a partially enlarged cross-sectional view of the plasma CVD device shown in FIG. 3. In FIGS. 3 and 4, the same symbols are attached to the same portions as in FIGS. 1 and 2, and only different portions will be explained.

An insulator 94 is formed on each of a surface which faces the first gap 81 and the second gap 82 of the anode 104, a surface which faces the third gap 83 and the sixth gap 86 of the spacer 93, a surface which faces the second gap 82, the fourth gap 84 and the fifth gap 85 of the anti-adhesion member 91, a surface which faces the fifth gap 85 and the sixth gap 86 of the pedestal 92 and the second inner surface 102b of the chamber, and a surface which faces the first gap 81 and the fourth gap 84 of the plasma wall 88. In addition, the insulator 94 is also formed on each of a surface which faces the first inner surface 102a of the anti-adhesion member 91 and a surface which faces the third inner surface 102c of the spacer 93. The insulator 94 is a black portion shown in FIGS. 3 and 4.

Although the maximum diameter of each of the first gap 81, the second gap 82, the third gap 83, the fourth gap 84, the fifth gap 85 and the sixth gap 86 is equal to or less than 4 mm (preferably equal to or less than 3 mm) as in the first embodiment, when the insulator 94 is formed on the surface facing each of the first gap 81, the second gap 82, the third gap 83, the fourth gap 84, the fifth gap 85 and the sixth gap 86, the maximum diameter from the surface of the insulator 94 is set equal to or less than 4 mm (preferably equal to or less than 3 mm).

The insulator 94 is preferably a substance which has a volume resistivity of $1 \times 10^{10}$ Ωcm or more (preferably $1 \times 10^{12}$ Ωcm or more) at 20° C. and which has heat resistance to 100° C. For example, the insulator 94 is preferably an insulator (for example, alumina, steatite or machinable ceramics) of any of glass, quartz, resin and ceramics. Moreover, the insulator 94 may be formed by any of a thermally sprayed insulator and an insulator subjected to alumite treatment and ceramic plating.

Although, in the plasma CVD device shown in FIGS. 3 and 4, the insulator 94 is formed at a plurality of positions, all of the insulators 94 may have the same material or may have different materials.

Also in the present embodiment, the same effects as in the first embodiment can be obtained.

Since, in the present embodiment, since the insulator 94 described above is formed on the surface opposite each of the first gap 81 and the second gap 82 of the anode 104 or the like, it is possible to prevent a short circuit even if carbon particles are accumulated in a gap whose diameter is equal to or less than 4 mm.

Note that, although, in the present embodiment, each of the spacer 93, the anti-adhesion member 91 and the plasma wall 88 is formed of a conductor, and the insulator 94 is formed on the surface of each of the spacer 93, the anti-adhesion member 91 and the plasma wall 88, each of the spacer 93, the anti-adhesion member 91 and the plasma wall 88 may be formed of an insulator. In such a case, the insulator is preferably a substance which has a volume resistivity of $1 \times 10^{10}$ Ωcm or more (preferably $1 \times 10^{12}$ Ωcm or more) at 20° C. and which has heat resistance to 100° C. For example, the insulator is preferably an insulator (for example, alumina, steatite or machinable ceramics) of any of glass, quartz, resin and ceramics.

Furthermore, although, in the present embodiment, the conductive film is not formed on the surface of the anode 104, there is no limitation on this configuration, and a thermally sprayed conductive film (not shown) may be formed on the surface on which the insulator 94 of the anode 104 is not formed. Accordingly, the effects similar to those of the conductive film described in the first embodiment can be obtained. The first to fourth conductive films similar to those in the first embodiment can be used as the thermally sprayed conductive film.

Third Embodiment

Figure 5:
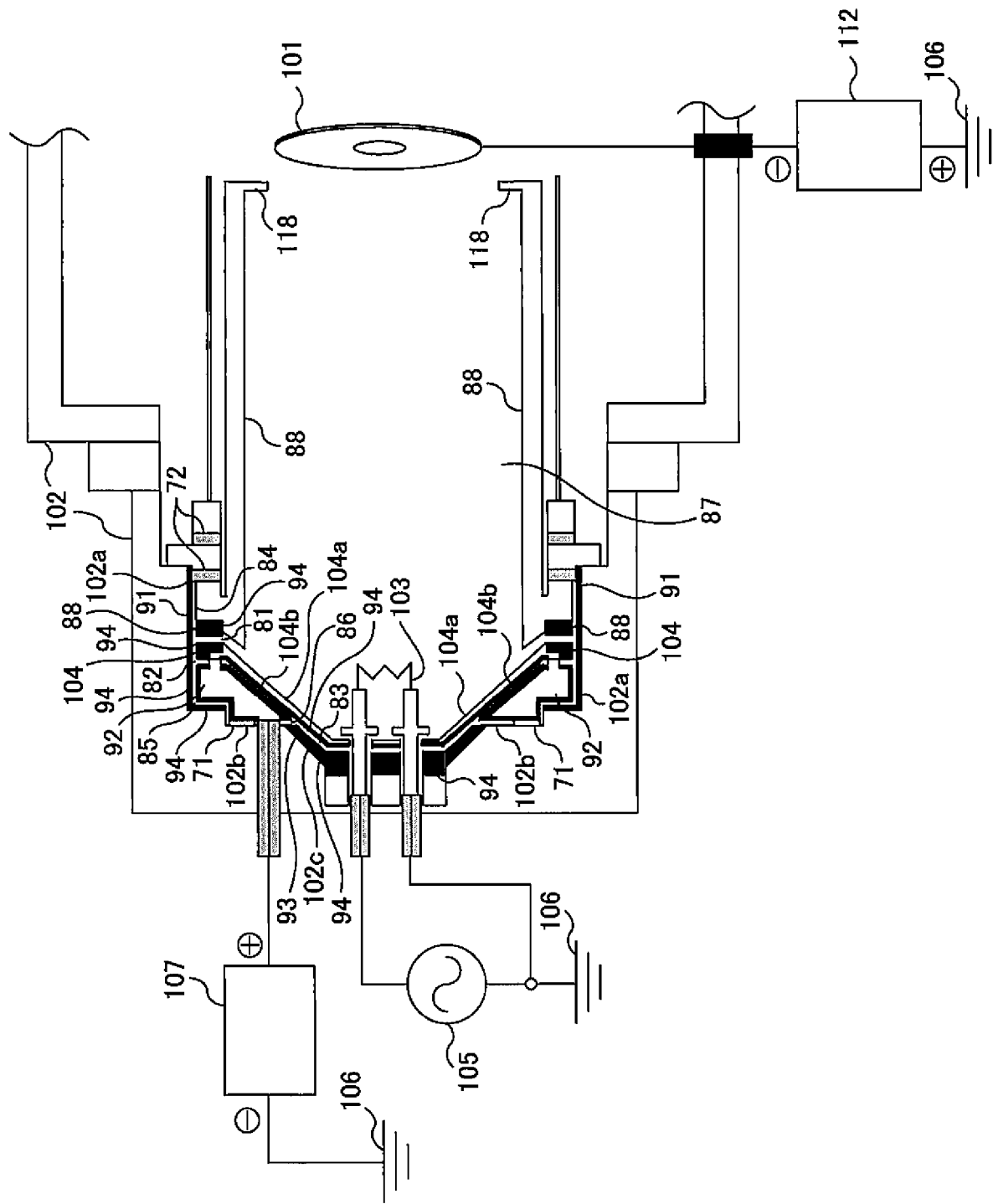
FIG. 5 is a cross-sectional view schematically showing the plasma CVD device according to the aspect of the present invention.
Figure 6:
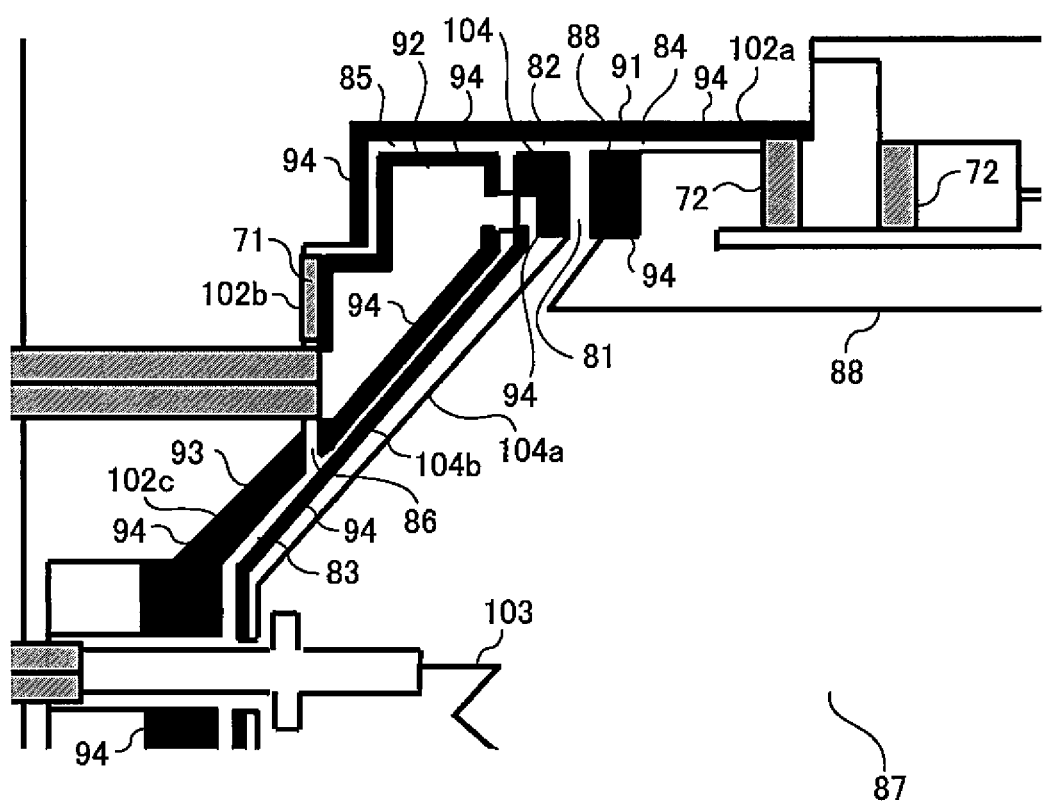
FIG. 6 is a partially enlarged cross-sectional view of the plasma CVD device shown in FIG. 5.

FIG. 5 is a cross-sectional view schematically showing the plasma CVD device according to the aspect of the present invention, and FIG. 6 is a partially enlarged cross-sectional view of the plasma CVD device shown in FIG. 5. In FIGS. 5 and 6, the same symbols are attached to the same portions as in FIGS. 3 and 4, and only different portions will be explained.

The insulator 94 is formed on the surface other than the electrode surface 104a of the anode 104. Namely, the insulator 94 is formed on the back surface 104b of the anode 104.

Also in the present embodiment, the same effects as in the second embodiment can be obtained.

Note that, although in the present embodiment, the conductive film is not formed on the electrode surface 104a of the anode 104, there is no limitation on this configuration, and a thermally sprayed conductive film (not shown) may be formed on the electrode surface 104a of the anode 104. Accordingly, the effects similar to those of the conductive film described in the first embodiment can be obtained. The first to fourth conductive films similar to those in the first embodiment can be used as the thermally sprayed conductive film.

(Modification)

Figure 7:
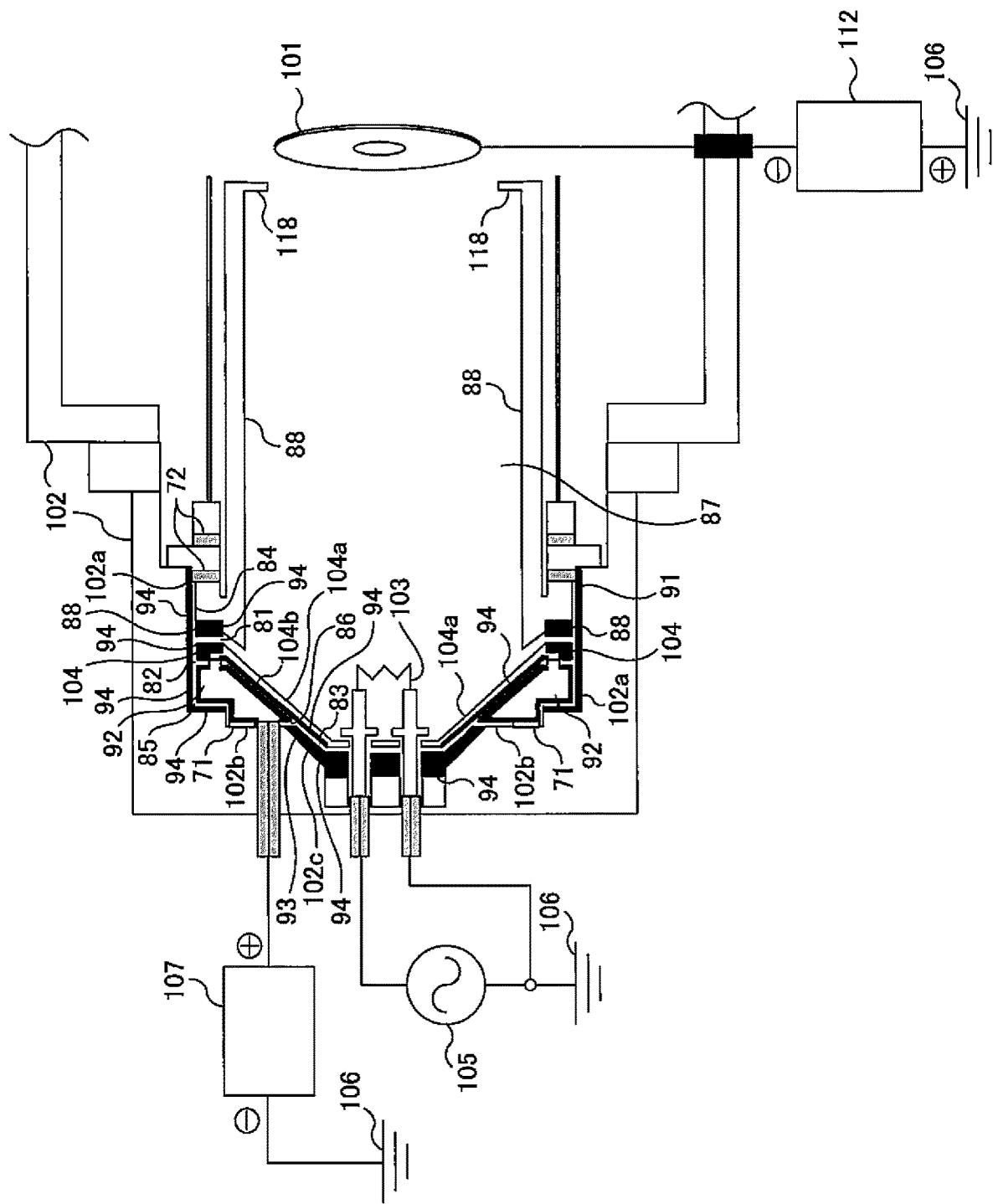
FIG. 7 is a cross-sectional view schematically showing a modification of the plasma CVD device shown in FIG. 5.
Figure 8:
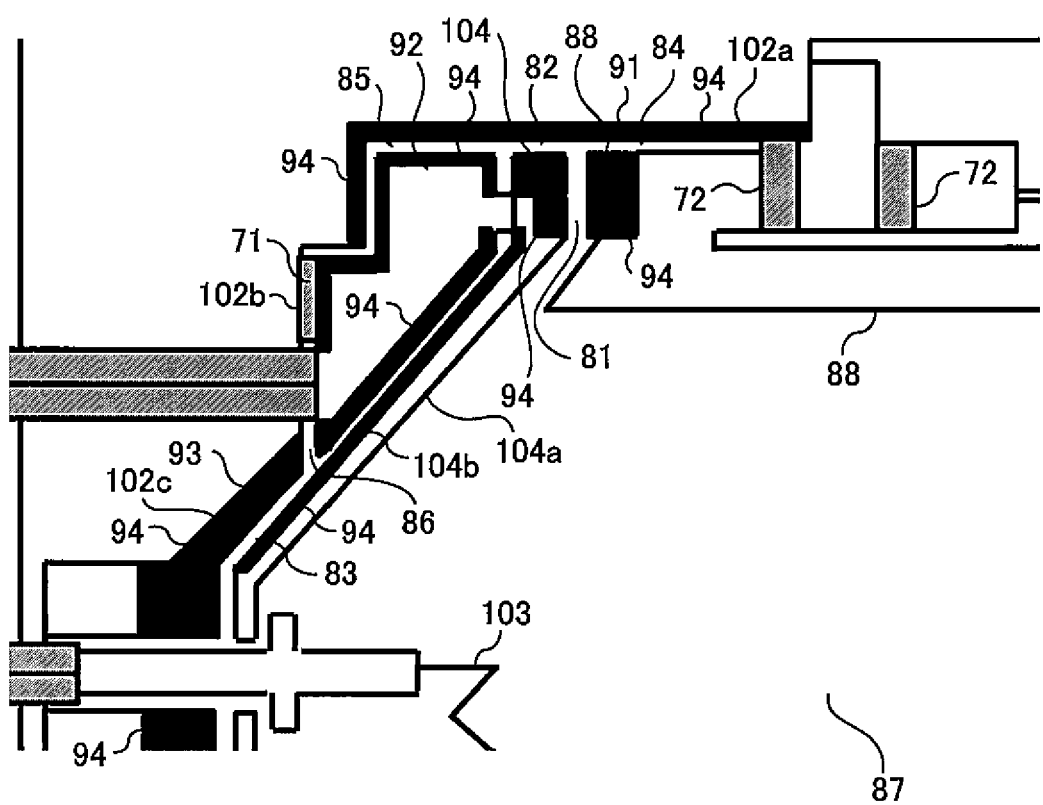
FIG. 8 is a partially enlarged cross-sectional view of the plasma CVD device shown in FIG. 7.
Figure 9:
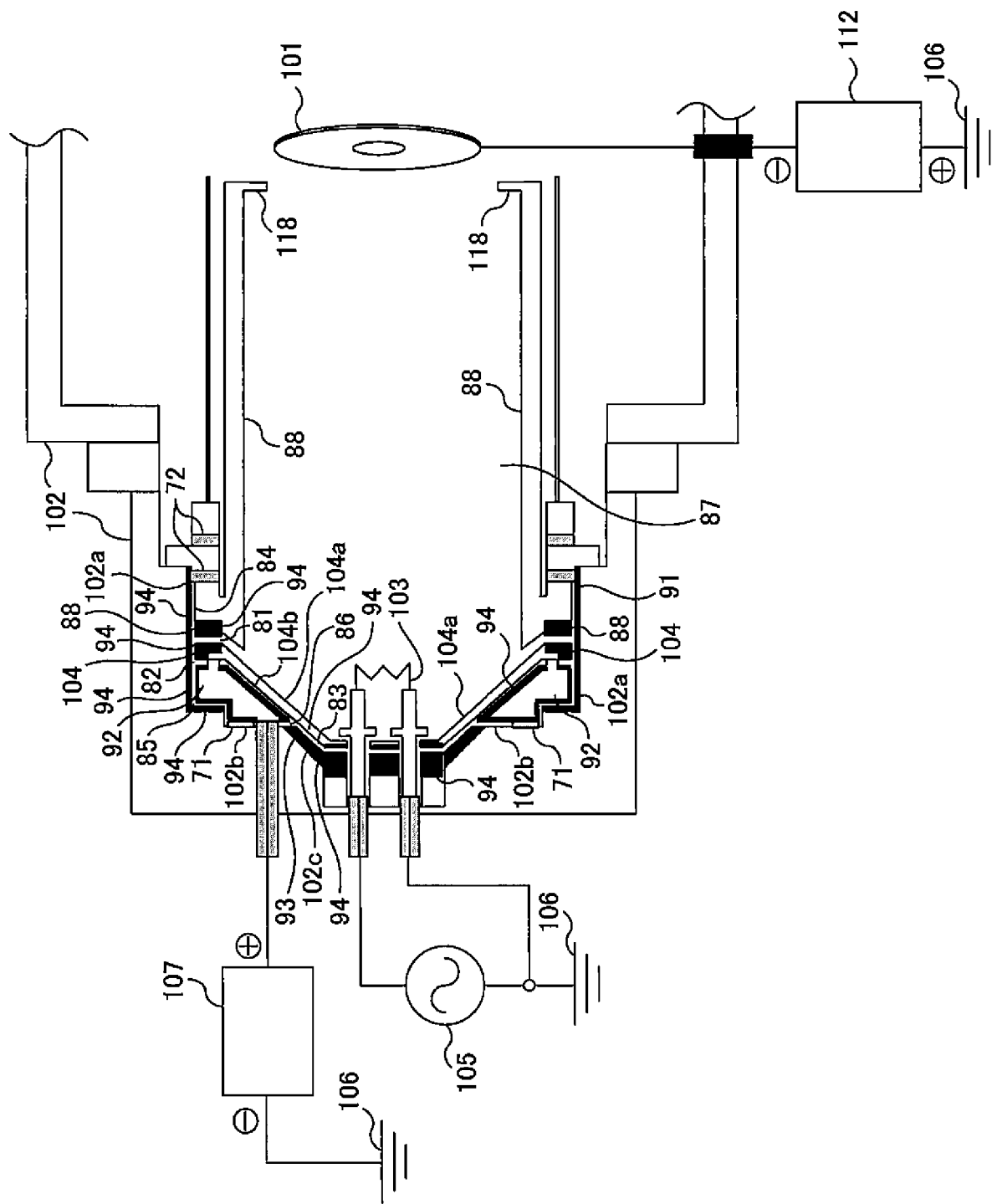
FIG. 9 is a cross-sectional view schematically showing a modification of the plasma CVD device shown in FIG. 5.
Figure 10:
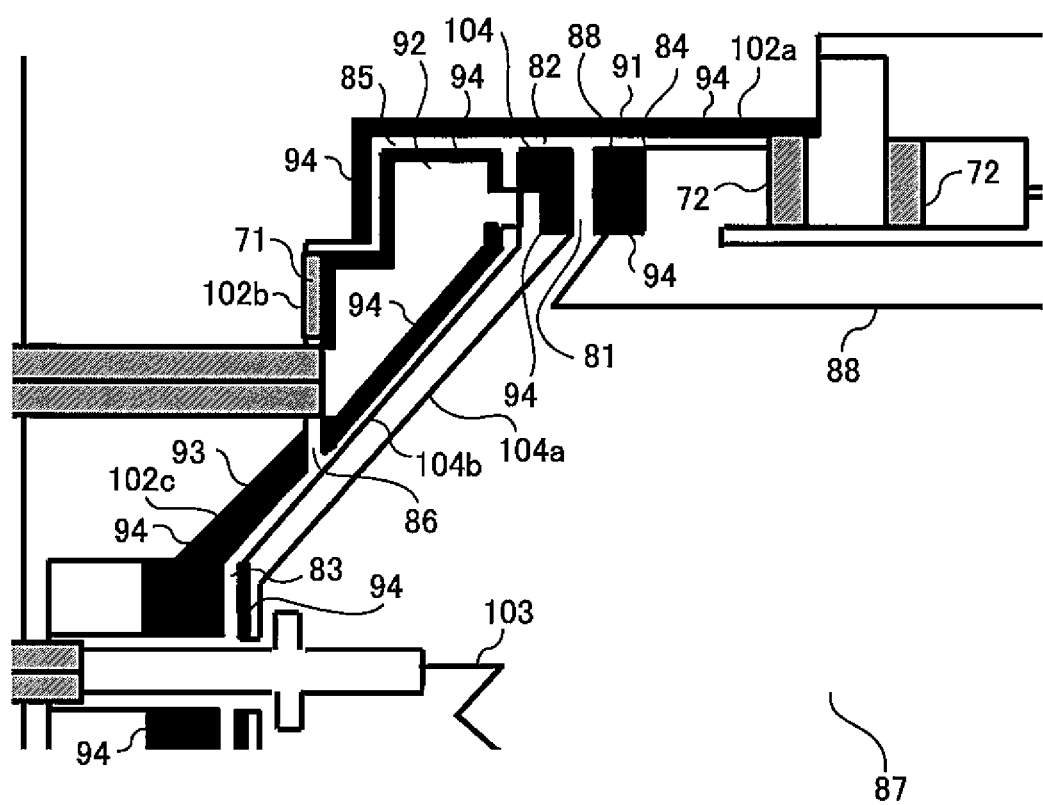
FIG. 10 is a partially enlarged cross-sectional view of the plasma CVD device shown in FIG. 9.

FIGS. 7 and 9 are cross-sectional views schematically showing a modification of the plasma CVD device shown in FIG. 5, FIG. 8 is a partially enlarged cross-sectional view of the plasma CVD device shown in FIG. 7, and FIG. 10 is a partially enlarged cross-sectional view of the plasma CVD device shown in FIG. 9. In FIGS. 7 to 10, the same symbols are attached to the same portions as in FIGS. 5 and 6, and only different portions will be explained.

In the plasma CVD device shown in FIGS. 7 to 10, the insulator 94 is formed on a part of the back surface 104b of the anode 104. Specifically, in the plasma CVD device shown in FIGS. 7 and 8, the insulator 94 is formed on the back surface 104b of the anode 104 and on the side of the pedestal 92, whereas in the plasma CVD device shown in FIGS. 9 and 10, the insulator 94 is formed on the back surface 104b of the anode 104 and on the side of the cathode electrode 103.

Also in the modification described above, the same effects as in the second embodiment can be obtained.

Furthermore, although in the modification, the conductive film is not formed on the surface of the anode 104, there is no limitation on this configuration, and the conductive film (not shown) thermally sprayed on the surface on which the insulator 94 of the anode 104 is not formed may be formed. Accordingly, the effects similar to those of the conductive film described in the first embodiment can be obtained. As the thermally sprayed conductive film, the same first to fourth conductive films as in the first embodiment can be used.

Example

TABLE 1

| Vp (V) | | 10 | 20 | 30 | 40 | 50 | 60 |
|---|---|---|---|---|---|---|---|
| 100 | Number of times Vp has reached 0 V at intervals of 10 minutes (60 times) after discharge start | 0 | 0 | 1 | 0 | 0 | 0 |
| | Number of times Ip has reached 1850 mA or more | 4 | 4 | 7 | 4 | 3 | 9 |

Figure 12:
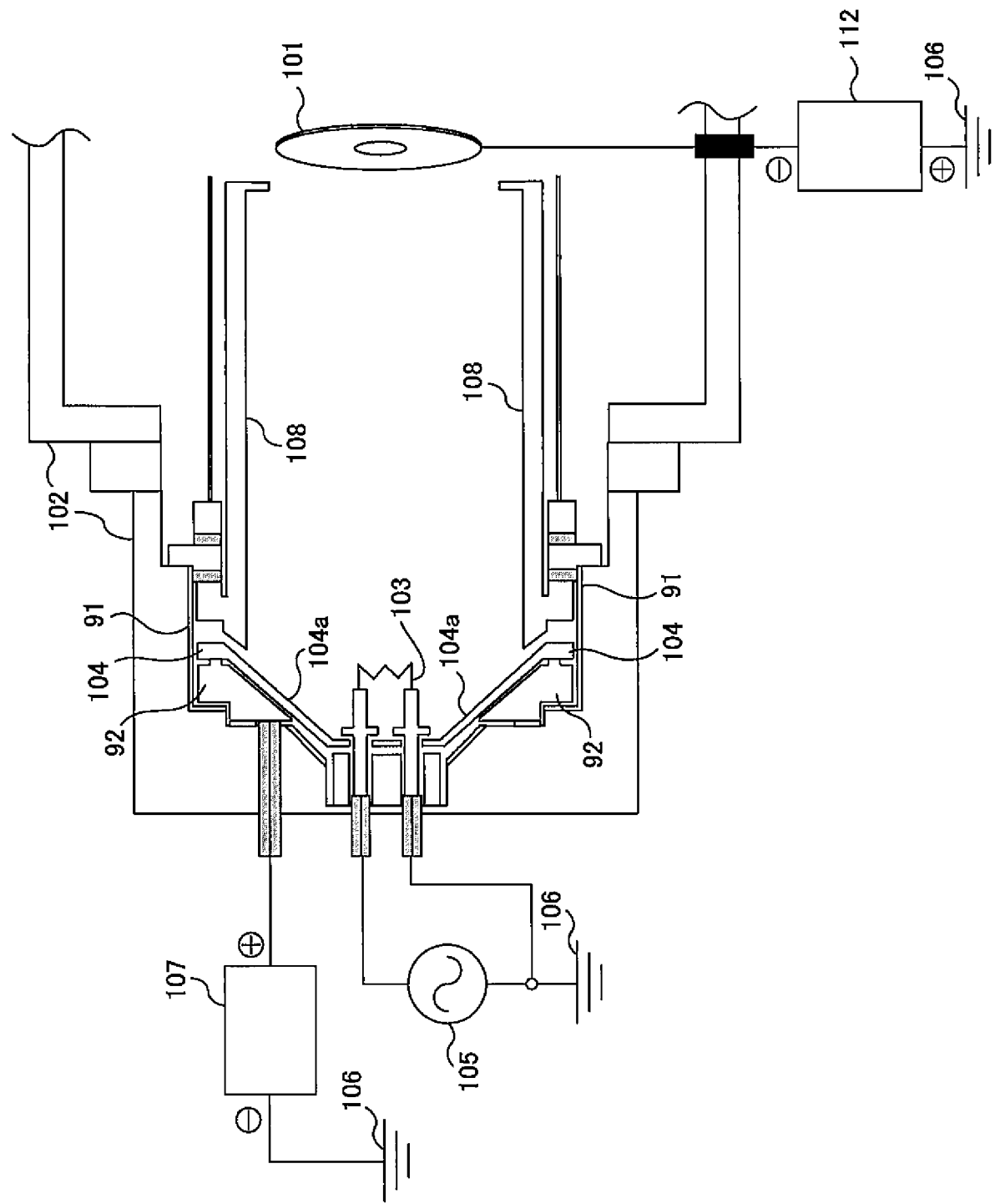
FIG. 12 is a cross-sectional view schematically showing a conventional plasma CVD device.
Figure 13:
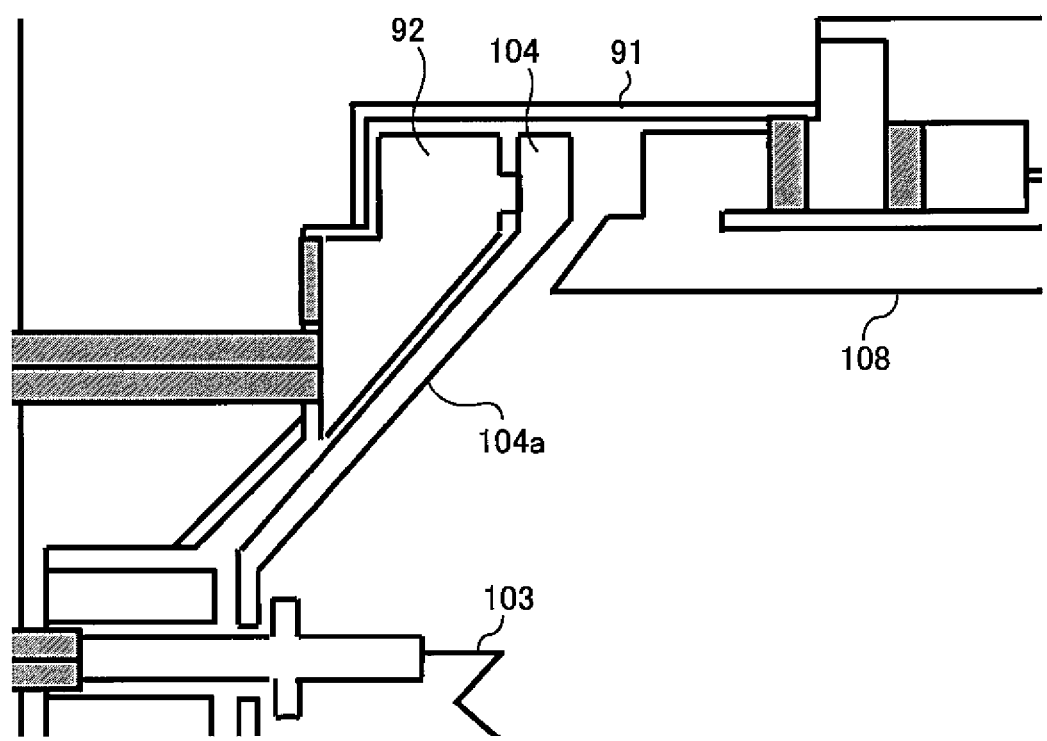
FIG. 13 is a partially enlarged cross-sectional view of the plasma CVD device shown in FIG. 12.

Table 1 shows the results of a discharge test which was performed through the use of a conventional plasma CVD device shown in FIGS. 12 and 13. The conditions of the discharge test are as follows.

Raw material gas: $C_7H_8$
Raw material gas flow rate: 3.25 sccm
Ar flow rate: 2.00 sccm
Output Pf of cathode power source (alternating-current power source 105): 230 W
Voltage Vp of anode power source (DC power source 107): 100 V
Current Ip of anode power source (DC power source 107): 1650 mA
Ip control width: 10 mA
Variation in power: 0.5 W
Pressure: 0.2 Pa
Cathode electrode 103: tantalum filament
Substrate to be deposited 101: NiP plating/Al disc (substrate where NiP plating was performed on the surface of a disc made of Al)
Size of substrate to be deposited 101: 42.5 inches
Voltage of bias power source (DC power source 112): 250 V In Table 1, the number of times the voltage Vp has reached 0 V at intervals of 10 minutes in the discharge state of 60 minutes is listed in the upper stage, and the number of times the current Ip has reached 1850 mA or more is listed in the lower stage. However, since the experiment was performed by one-time discharge every 10 seconds, the discharge was performed 60 times for 10 minutes. Furthermore, the reason why the voltage Vp of the anode power source reaches 0 V is that a protective circuit works because of excessive flow of current due to an abnormal discharge and thus the voltage Vp of the anode power source is temporarily dropped to 0 V. Moreover, the number of times the current Ip has reached 1850 mA or more corresponds to a case where the protective circuit does not work even if the current Ip has reached 1850 mA or more.

In addition, the results shown in Table 1 are based on after the elapse of 60 minutes from the start of the discharge. Since the discharge was not stable for about 60 minutes after the start of the discharge, the following data is listed in Table 1 on the basis of 10 minutes after the start of the discharge. Namely, the "10 minutes" in Table 1 corresponds to 70 minutes after the start of the discharge including the first 60 minutes.

TABLE 2

| Vp (V) | F.R. (sccm) | | 10 | 20 | 30 | 40 | 50 | 60 |
|---|---|---|---|---|---|---|---|---|
| 100 | 3.25 | Number of times Vp has reached 0 V at intervals of 10 minutes (60 times) after discharge start | 0 | 0 | 0 | 0 | 0 | 0 |
| | | Number of times Ip has reached 1850 mA or more | 0 | 2 | 0 | 0 | 0 | 1 |

Table 2 shows the results of a discharge test which was performed through the use of the plasma CVD device shown in FIGS. 7 and 8. Since the conditions of the discharge test are similar to those of the discharge test shown in Table 1, the description thereof will be omitted. Note that a thermally sprayed insulator was used as the insulator of the plasma CVD device used in this test.

TABLE 3

| Vp (V) | F.R. (sccm) | | 10 (250) | 20 (260) | 30 (270) | 40 (280) | 50 (290) | 60 (300) |
|---|---|---|---|---|---|---|---|---|
| 100 | 3.25 | Number of times Vp has reached 0 V at intervals of 10 minutes (60 times) after discharge start | 0 | 0 | 0 | 0 | 0 | 0 |
| | | Number of times Ip has reached 1850 mA or more | 0 | 0 | 0 | 1 | 0 | 0 |

Table 3 shows the results of a discharge test which was performed through the use of the plasma CVD device shown in FIGS. 3 and 4. Since the conditions of the discharge test are similar to those of the discharge test shown in Table 1, the description thereof will be omitted. Note that a thermally sprayed insulator was used as the insulator of the plasma CVD device used in this test.

It was confirmed from Tables 1, 2 and 3 that the plasma CVD device (FIGS. 3, 4, 7 and 8) in which the gap was set equal to or less than 4 mm and in which the insulator was formed was able to suppress an abnormal discharge, as compared with the plasma CVD device (FIGS. 12 and 13) in which the gap was not set equal to or less than 4 mm and in which the insulator was not formed.

Figure 11:
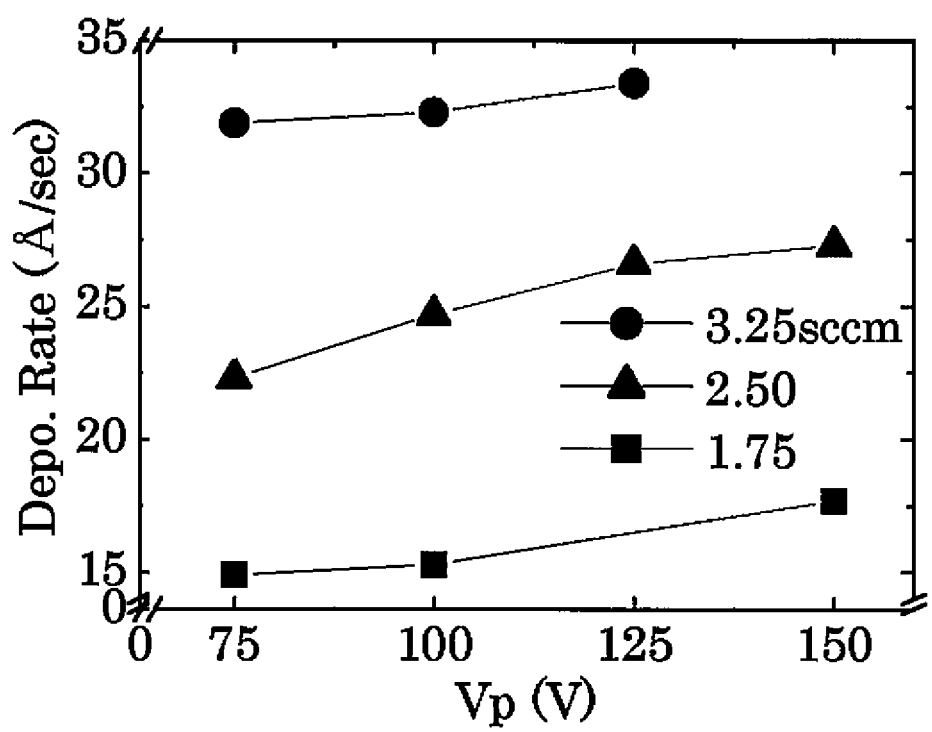
FIG. 11 is a graph showing a relationship between the deposition rate of a DLC film and a voltage Vp in Example.

Then, there are shown, in FIG. 11, the results of a test in which under the conditions of the discharge test shown in Table 2, a DLC film was deposited on the substrate to be deposited while the voltage Vp of the anode power source and the raw material gas flow rate (3.25 sccm, 2.50 sccm, 1.75 sccm) were varied.

FIG. 11 is a graph showing a relationship between the rate of deposition of the DLC film and the voltage Vp.

It was confirmed that in the measurement of the rate of deposition of the DLC film, all of the raw material gas flow rates were increased by the increase in Vp as shown in FIG. 11.

BRIEF DESCRIPTION OF THE REFERENCE SYMBOLS 71, 72 insulator
81 first gap
82 second gap
83 third gap
84 fourth gap
85 fifth gap
86 sixth gap
87 space
88 plasma wall
91 anti-adhesion member
92 pedestal
93 spacer
94 insulator
101 substrate to be deposited
102 chamber
102a first inner surface
102b second inner surface
102c third inner surface
103 cathode electrode
104 anode
104a electrode surface
104b back surface of anode
105 cathode power source (alternating-current power source)
106 ground power source
107 anode power source (DC (direct-current) power source)
108 plasma wall
112 bias power source (DC power source, direct-current power source)
118 film thickness correction plate

The invention claimed is:

1. A plasma CVD device comprising:
a chamber;
an anode which is arranged within said chamber and which has an electrode surface on a front surface;
a cathode which is arranged within said chamber;
a holding portion which is arranged within said chamber and which holds a substrate to be deposited which is arranged so as to face said electrode surface of said anode and said cathode;
a plasma wall which is arranged within said chamber and which is provided so as to cover a space between said substrate to be deposited held by said holding portion and each of said electrode surface of said anode and said cathode;
an anti-adhesion member which is arranged between a first gap between said anode and said plasma wall and a first inner surface of said chamber and which is in contact with said first inner surface of said chamber;
a pedestal which is arranged between said anti-adhesion member and a back surface of said anode and between the back surface of said anode and a second inner surface of said chamber and which is electrically connected to said anode;
a spacer which is arranged between said back surface of said anode and a third inner surface of said chamber and which is in contact with said third inner surface;
a first direct-current power source which is electrically connected to said pedestal;
an alternating-current power source which is electrically connected to said cathode;
a second direct-current power source which is electrically connected to said substrate to be deposited held by said holding portion;
a gas supply mechanism which supplies a raw material gas into said chamber; and
an exhaust mechanism which exhausts said chamber,
wherein each of a maximum diameter of said first gap, a maximum diameter of a second gap between said anode and said anti-adhesion member, a maximum diameter of a third gap between said back surface of said anode and said spacer, a maximum diameter of a fourth gap between said plasma wall and said anti-adhesion member, a maximum diameter of a fifth gap between said anti-adhesion member and said pedestal and a maximum diameter of a sixth gap between said pedestal and said spacer is equal to or less than 4 mm;
said first inner surface of said chamber faces said plasma wall and said pedestal;

said second inner surface of said chamber faces said pedestal; and said third inner surface of said chamber faces said back surface of said anode.

2. The plasma CVD device according to claim 1, wherein an insulator is formed on each of a surface facing each of said first gap and said second gap of said anode, a surface facing each of said third gap and said sixth gap of said spacer, a surface facing each of said second gap, said fourth gap and said fifth gap of said anti-adhesion member, a surface facing each of said fifth gap, said sixth gap and said second inner surface of said pedestal and a surface facing each of said first gap and said fourth gap of said plasma wall.

3. The plasma CVD device according to claim 2, wherein an insulator is formed on each of a surface facing said first inner surface of said anti-adhesion member and a surface facing said third inner surface of said spacer.

4. The plasma CVD device according to claim 2, wherein an insulator is formed on a surface facing said third gap of said back surface of said anode.

5. The plasma CVD device according to claim 2, wherein an insulator is formed on a surface other than said electrode surface of said anode.

6. The plasma CVD device according to claim 2, wherein said insulator is a substance which has a volume resistivity of $1 \times 10^{10}$ Ωcm or more at 20° C. and which has heat resistance to 100° C.

7. The plasma CVD device according to claim 2, wherein said insulator is individually any of glass, quartz, resin, ceramics, a thermally sprayed insulator, an insulator subjected to alumite treatment and ceramic plating.

8. The plasma CVD device according to claim 2, wherein a thermally sprayed conductive film is formed either on a surface on which said insulator of said anode is not formed or on said electrode surface of said anode.

9. The plasma CVD device according to claim 1,
wherein each of said spacer, said anti-adhesion member and said plasma wall is formed of an insulator, and
an insulator is formed on each of a surface facing each of said first gap and said second gap of said anode and a surface facing each of said fifth gap, said sixth gap and said second inner surface of said pedestal.

10. The plasma CVD device according to claim 1, wherein a thermally sprayed conductive film is formed on a surface of said anode.

11. A method of manufacturing a magnetic recording medium using the plasma CVD device according to claim 1,
wherein a substrate to be deposited in which at least a magnetic layer is formed on a non-magnetic substrate is held by said holding portion, and
said raw material gas is brought into a plasma state by a discharge between said cathode and said electrode surface of said anode within said chamber, and the plasma is accelerated to collide with a surface of said substrate to be deposited held by said holding portion to thereby form a protective layer whose main component is carbon.

12. A method of manufacturing a magnetic recording medium including forming a protective layer whose main component is carbon, after at least a magnetic layer is formed on a non-magnetic substrate,
wherein said protective layer is formed using the plasma CVD device according to claim 1.

* * * * *